(12) United States Patent
Sarajlic

(10) Patent No.: US 9,086,431 B2
(45) Date of Patent: Jul. 21, 2015

(54) METHOD OF MANUFACTURING A PROBE COMPRISING A CANTILEVER WITH A CONDUIT

(75) Inventor: Edin Sarajlic, Zutphen (NL)

(73) Assignee: SmartTip B.V., Enschede (NL)

( * ) Notice: Subject to any disclaimer, the term of this patent is extended or adjusted under 35 U.S.C. 154(b) by 136 days.

(21) Appl. No.: 13/978,502

(22) PCT Filed: Jan. 13, 2012

(86) PCT No.: PCT/NL2012/000007
§ 371 (c)(1),
(2), (4) Date: Jul. 5, 2013

(87) PCT Pub. No.: WO2012/096571
PCT Pub. Date: Jul. 19, 2012

(65) Prior Publication Data
US 2013/0305519 A1 Nov. 21, 2013

(30) Foreign Application Priority Data

Jan. 14, 2011 (NL) .................................... 1038521
Feb. 8, 2011 (NL) .................................... 1038570

(51) Int. Cl.
*H01R 43/00* (2006.01)
*G01R 3/00* (2006.01)
(Continued)

(52) U.S. Cl.
CPC .............. *G01R 3/00* (2013.01); *B81C 1/00119* (2013.01); *B01L 3/502707* (2013.01); *B81B 2201/057* (2013.01); *B81B 2203/0118* (2013.01);
(Continued)

(58) Field of Classification Search
CPC ................. B81B 2201/057; B81B 2203/0118; B81B 2203/0338; G01R 3/00; B81C 2201/0109; B81C 1/00119; B01L 3/502707; Y10T 29/49002; Y10T 29/49121; Y10T 29/49139; Y10T 29/49224
USPC ........... 29/592.1, 827, 837, 847, 885; 73/105; 250/306
See application file for complete search history.

(56) References Cited

U.S. PATENT DOCUMENTS 5,347,226 A * 9/1994 Bachmann et al. ........... 324/724
6,265,711 B1 * 7/2001 Kley ............................. 250/234
(Continued)

FOREIGN PATENT DOCUMENTS

JP 2003254886 A * 9/2003
WO 2010/012423 A1 2/2010

OTHER PUBLICATIONS

Xu et al., Microfabricated Quill-Type Surface Patterning Tools for the Creation of Biological Micro/Nano Arrays, Biomedical Microdevices, Jun. 1, 2004, vol. 6, No. 2, p. 117-123, Kluwer Academic Publishers, Netherlands.
(Continued)

*Primary Examiner* — Paul D Kim
(74) *Attorney, Agent, or Firm* — Shewchuk IP Services, LLC; Jeffrey D. Shewchuk

(57) ABSTRACT

The present invention relates to a method of manufacturing a probe comprising a cantilever with a conduit. According to the invention, an etchant window is provided in a layer covering an elongated sacrificial conduit core that is to form the conduit. This allows for an etching process where the elongated sacrificial conduit core is etched away before all material of a substrate is etched away, the remaining material of the substrate material making the probe stronger without being in the way during use of the probe.

7 Claims, 5 Drawing Sheets

Figure 1:
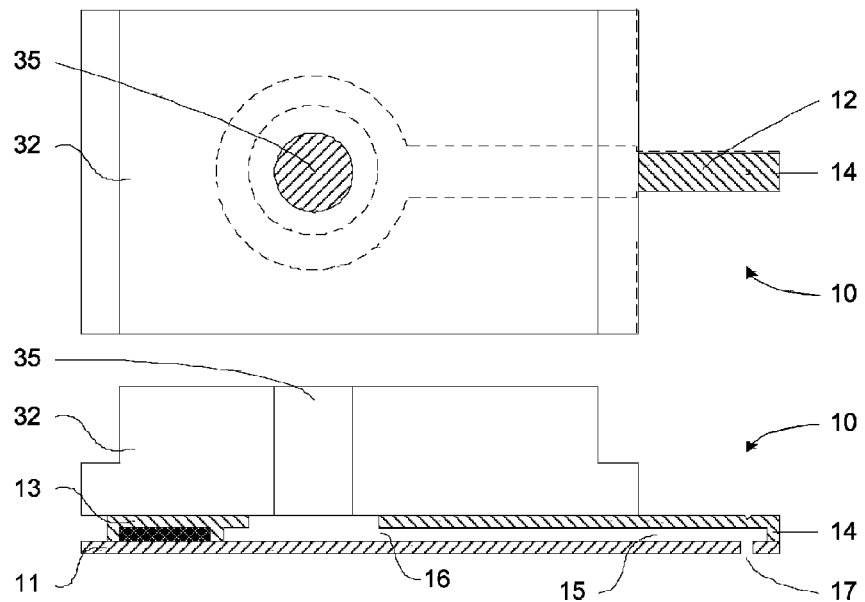

(51) Int. Cl.
*B81C 1/00* (2006.01)
*B01L 3/00* (2006.01)

(52) U.S. Cl.
CPC . *B81B2203/0338* (2013.01); *B81C 2201/0109* (2013.01); *Y10T 29/49002* (2015.01)

(56) References Cited

U.S. PATENT DOCUMENTS 7,437,813 B2 * 10/2008 Tunaboylu et al. ........ 29/402.13
7,637,007 B2 * 12/2009 Tunaboylu et al. ............. 29/846
7,975,363 B2 * 7/2011 Wang et al. .................. 29/592.1
2005/0236566 A1 10/2005 Liu

OTHER PUBLICATIONS

Deladi et al., Fabrication of Micromachined Fountain Pen With In Situ Characterization Possibility of Nanoscale Surface Modification, Journal of Micromechanics and Microengineering, Dec. 23, 2004, vol. 15, p. 528-534, Institute of Physics Publishing, Bristol, UK.

* cited by examiner

METHOD OF MANUFACTURING A PROBE COMPRISING A CANTILEVER WITH A CONDUIT

The present invention relates to a method of manufacturing a probe, said probe comprising
- a planar substrate, and
- a cantilever extending from said planar substrate, said cantilever having a base end connected to the planar substrate and a distal end, and
- a conduit extending from i) a first opening at the planar substrate away from the cantilever to ii) a second opening in the cantilever away from the base end;

the method involving etching a planar half-product, said planar half-product comprising a sandwich of a first layer of a first material, a second layer of a second material, a third layer of a third material on top of i) the second layer and ii) an elongated sacrificial conduit core of a fourth material, the second and third material being different from the first and fourth material, the planar half-product having a first side at the side of the first layer and a second side at the side of the third material, the second side being provided with a cover having a cover hole, the second layer having a patterned cantilever structure, the elongated sacrificial conduit core of the fourth material extending from the first layer at the patterned cantilever structure to the second side at the location of the cover hole.

In the art a probe is known with a freely extending cantilever, the probe having a through channel (conduit) extending from a location near the distal end of the cantilever to the planar surface of the probe. This allows, for example, for passing a liquid from the probe to an object near the distal end of the cantilever. Because the diameter of the conduit is very small, relatively high pressures are required to pass the liquid through the conduit. However, this may result in destruction of the probe, in particular of the second layer at the location of the cover hole, because right at the location of the cover hole the probe is rather weak.

The object of the present invention is to provide a method of manufacturing a probe with improved strength properties.

To this end, a method according to the preamble is characterized in that the third layer is provided with an etchant window extending from the cover hole towards the cantilever over part of the distance from the cover hole to the base end, said etchant window exposing part of the elongated sacrificial conduit core, and the method comprises the step of removing the elongated sacrificial conduit core and removing first material of the first layer while leaving the second and third layer, by exposing
- the first side,
- the elongated sacrificial conduit core at the second side, and
- the edge of the planar half-product towards which the cantilever structure points with an etchant;
- removing material from the first layer and the fourth layer by etching, so as to form
  - a freely extending cantilever, and
  - an open conduit between the cover hole and the distal end;
- and ending the step of etching the first layer before an etch front of the first layer reaches the location of the first opening of the planar substrate.

This results in a probe reinforced by remaining material of the first layer at the location of the cover hole, whereas the first layer is relatively thin or (usually) absent at the base end of the cantilever. Thus the cantilever can be brought to the object to which liquid has to be delivered without being hampered by material of the first layer being present at the base end while the remaining material of the first layer makes destruction of the probe as a result of a high liquid pressure harder. If the first and fourth material can be removed using the same etchant, then the method is very simple and efficient as well.

According to a preferred embodiment, the method comprises the steps of
- providing a first substrate of a first material to act as the first layer with a second layer of a second material, the second material being different from the first material;
- removing material from the second layer of the second material to form a first hole in the second layer of the second material exposing the first substrate of the first material, where the first hole will become the second opening, and providing the second layer with a cantilever structure;
- providing a fourth layer of a fourth material on top of the second layer of the second material and the first material of the first layer so as to form an elongated sacrificial conduit core, the fourth material being different from the second material, said elongated sacrificial conduit core having
  - a first end at a location where the first opening will be formed by removal of fourth material, and
  - a second end filling the first hole;
- providing a third layer of a third material, said third material being different from the first material and the fourth material, on top of the fourth layer such that at the first end of the elongated sacrificial conduit part of the fourth layer is exposed;

so as to provide the half-product comprising a patterned cantilever structure;
- providing the half-product at the side of the third layer with a cover having a cover hole, such that the cover hole coincides with the first end of the elongated sacrificial conduit core and leaving the first end of the elongated sacrificial conduit part of the fourth layer is exposed,
- removing material from the fourth layer and the first layer by etching, so as to form
  - a freely extending cantilever, and
  - an open conduit between the cover hole and the distal end.

Thus a planar half-product can be obtained conveniently, which can subsequently be used to manufacture the probe.

According to a preferred embodiment, the cover is a glass cover.

Glass is resistant to a wide range of liquids that might have to be passed through the conduit, and can be chosen to have a desired thermal expansion coefficient. It is also brittle, allowing probes to be broken off from neighbouring probes, in particular if the glass had been provided with a groove for dicing.

According to a favourable embodiment, the etchant is chosen such that it etches both the material of the first layer and the material of the fourth layer.

This makes the method very easy to perform. This objective can be easily achieved if the first and the fourth material are identical, e.g. both silicon.

According to a preferred embodiment, the first material is silicon.

Silicon is a material that can be etched very predictably, in particular if the silicon is monocrystalline silicon.

According to a preferred embodiment, the fourth material is silicon.

This will be etched simultaneously with the first material, if the first material is also silicon.

According to a preferred embodiment, the material of the second layer and the material of the third layer are independently chosen from silicon nitride and silicon oxide.

These are very suitable materials capable of resisting etchant used for removal of first and fourth material where those materials are silicon.

Figure 2:
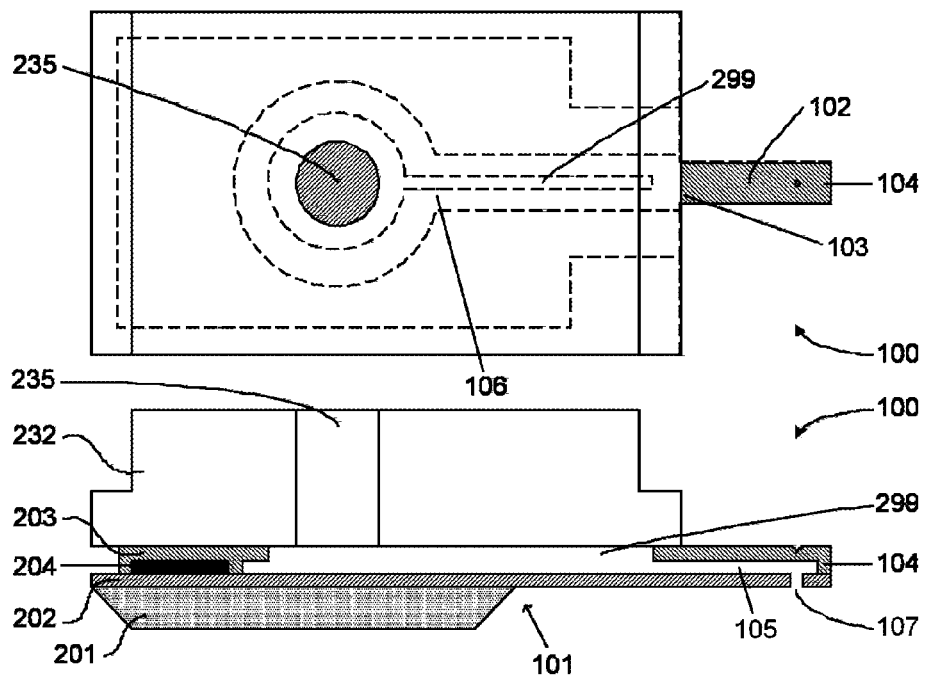

The present invention will now be illustrated with reference to the drawing where FIG. 1 shows a probe according to the state of the art, in top view (top) and cross-sectional view (bottom), both views being vertically aligned;

FIG. 2 shows a probe as can be manufactured using the method according to the invention, in top view (top) and cross-sectional view (bottom), both views being vertically aligned; and FIGS. 3 to 12 illustrate the method steps for manufacturing the probe of FIG. 1, in top view (top) and cross-sectional view (bottom), both views being vertically aligned.

FIG. 1 shows a prior art probe 10 comprising a base 11 with a cantilever 12 extending from the base 11. The cantilever 12 has a base end 13 and a distal end 14. The probe 10 comprises an elongated conduit 15 extending from a location at the base 11 to the cantilever 12. The elongated conduit 15 has a first opening 16 at said location on the planar substrate and a second opening 17 near the distal end 14 of the cantilever 12. The probe comprises a cover 32 with a cover hole 35. At the location of said cover hole 35 the base 11 is very weak.

FIG. 2 shows a probe 100 comprising a planar substrate 101 with a cantilever 102 extending from the planar substrate 101. The cantilever 102 has a base end 103 and a distal end 104. The probe 101 comprises an elongated conduit 105 extending from a location at the planar substrate to the cantilever 102. The elongated conduit 105 has a first opening 106 at said location on the planar substrate where it opens into an area where the probe is relatively weak because of the large lumen where layers are inherently not interconnected) and a second opening 107 near the distal end 104 of the cantilever 102.

FIGS. 3 to 11 show top views (top) and cross-sectional views (bottom) along the horizontal centerline of the top view) of the manufacturing process.

Figure 3:
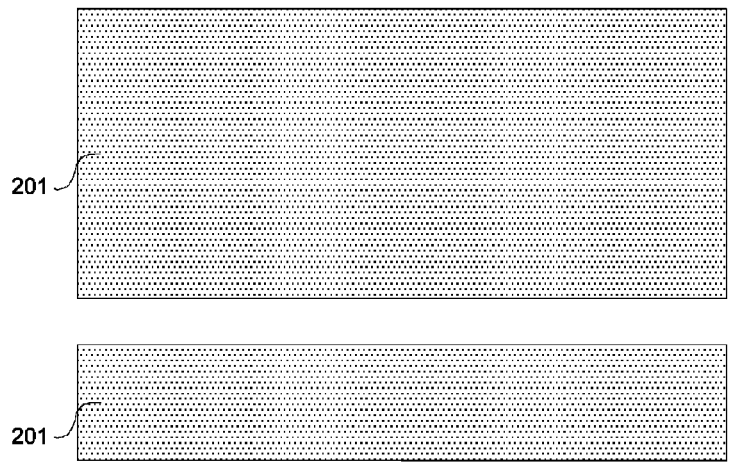

In FIG. 3 a silicon wafer 201 having a thickness of 380 um is shown. The silicon wafer 201 is material of the first layer and is of (1,0,0) silicon. The method according to the present invention allows for a multitude of probes 100 to be manufactured at once, but the figures will show one probe 100 in the making only.

Figure 4:
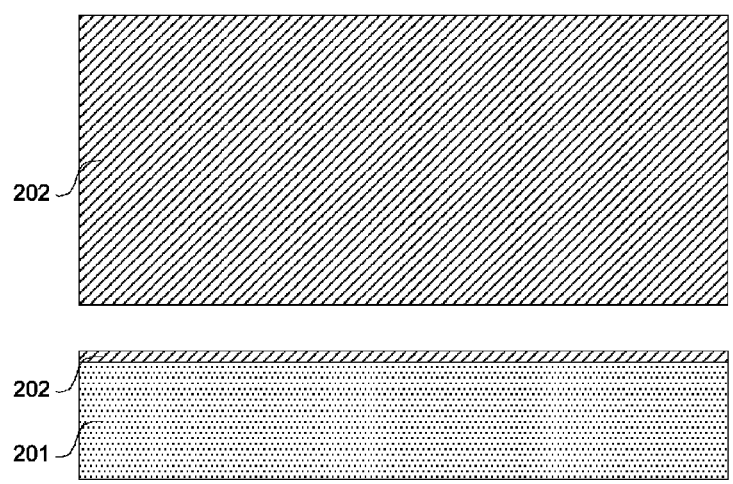
Figure 5:
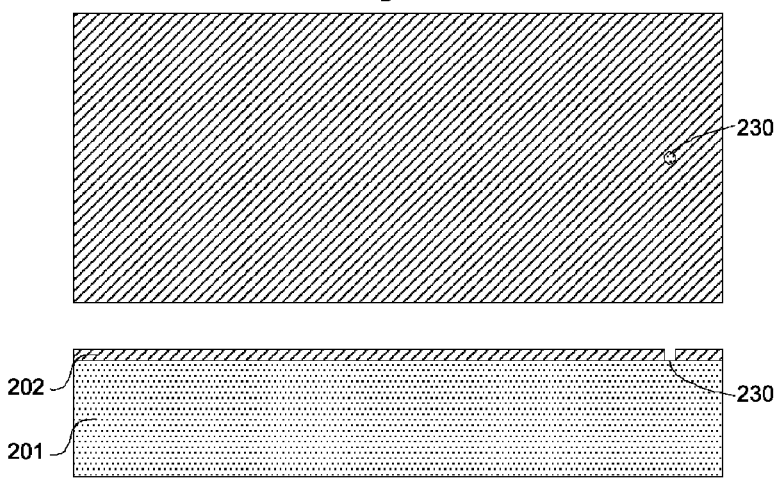
Figure 6:
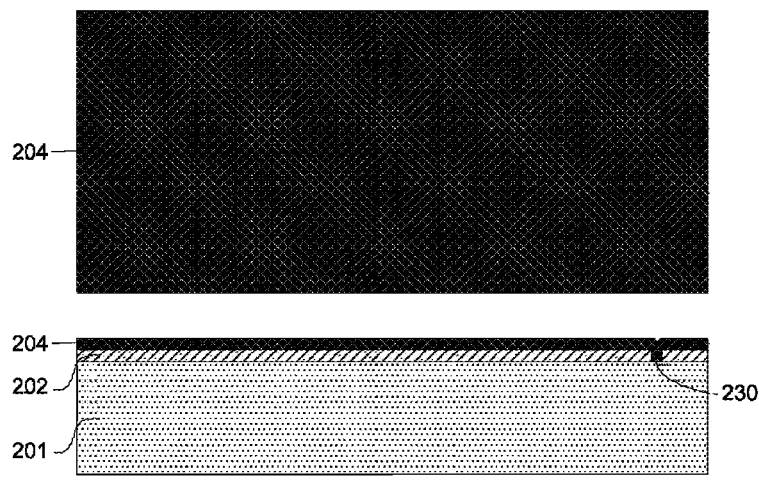
Figure 7:
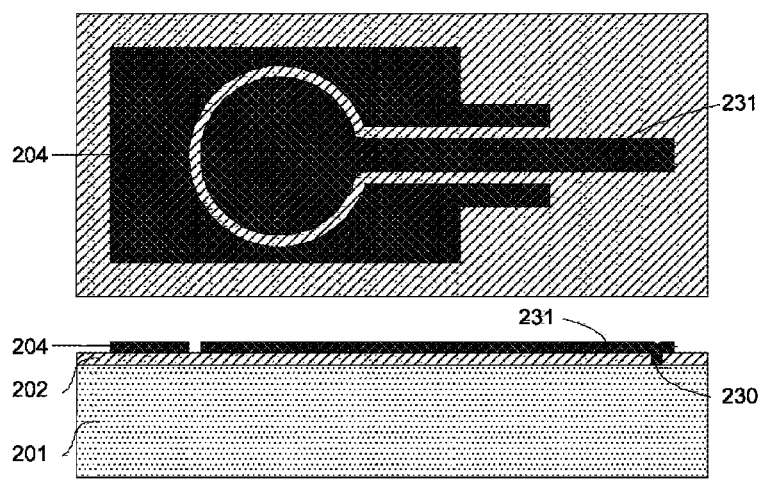
Figure 8:
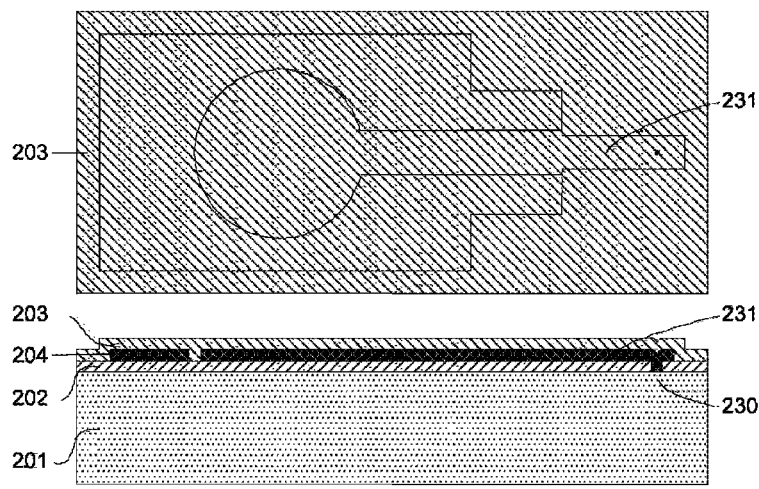
Figure 9:
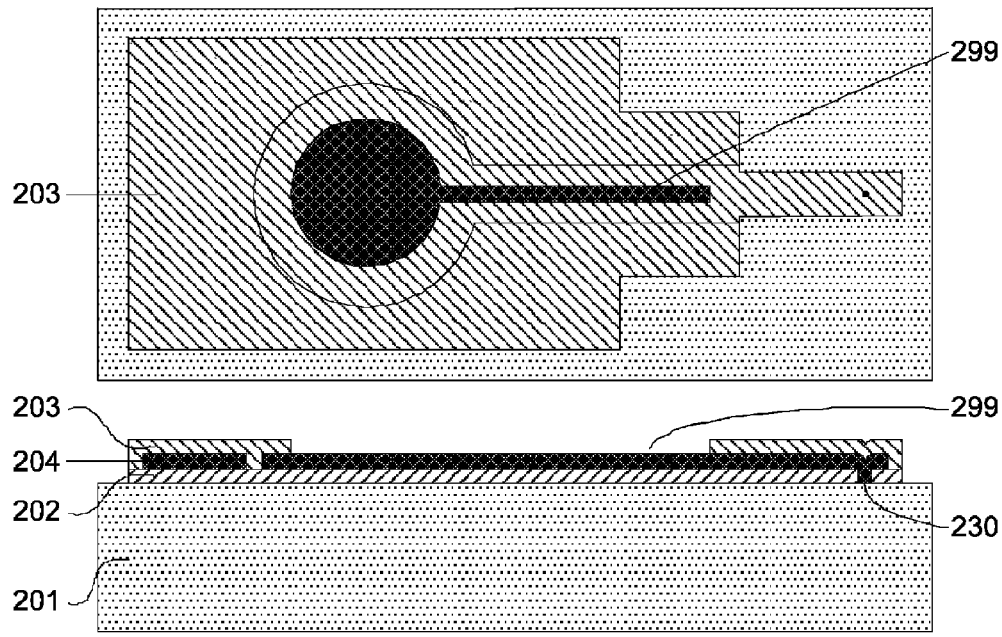

The silicon wafer 201 is provided with a 350 nm silicon nitride layer as the second layer 202 (FIG. 4).

A hole 230 is formed in the second layer 202 (FIG. 5) by Reactive Ion Etching (RIE), which hole 230 will eventually become the second opening 107.

Next a polycrystalline silicon layer 204 is deposited (FIG. 6) with a thickness of 1 um, polycrystalline silicon being the fourth material that fills the hole 230.

The polycrystalline fourth layer 204 is etched (FIG. 7) to provide an elongated conduit core 231.

A third layer 203 of silicon nitride having a thickness of 350 nm is deposited on top of the second layer 202 and the fourth layer 204 (FIG. 8) and subsequently etched (FIG. 9) to create an etching window 299 so as to expose part of the fourth layer 204 in the direction of the base end 103.

Figure 10:
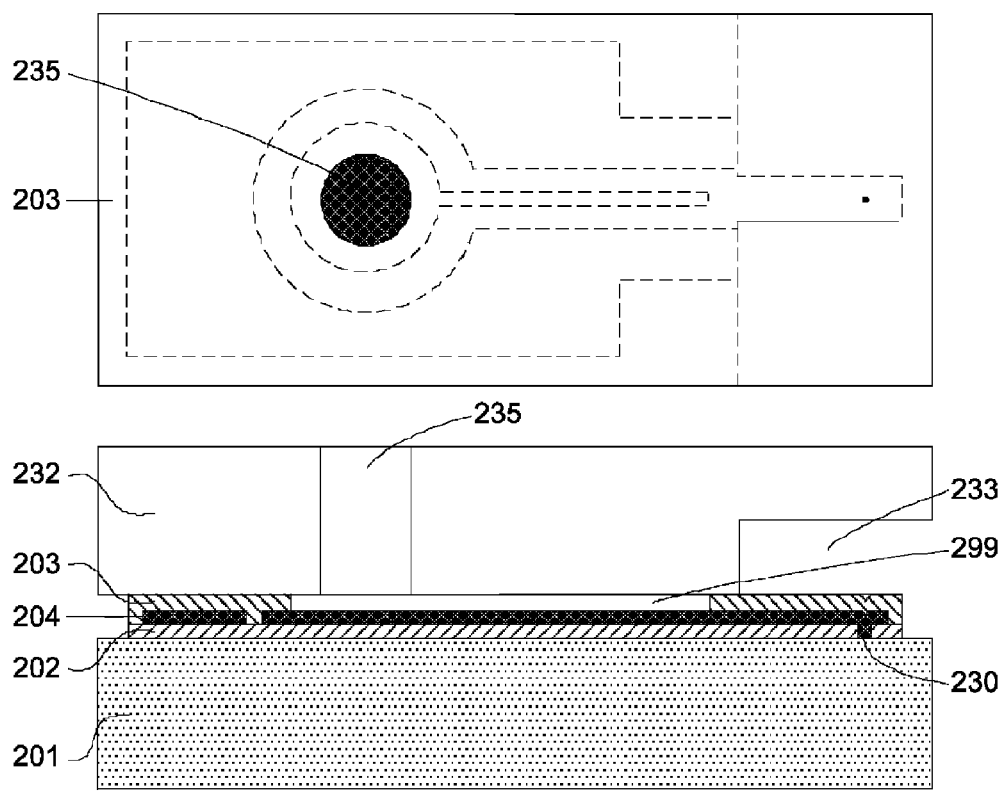

The third layer 203 is bonded to a glass cover 232 by anodic bonding (FIG. 10). The glass cover 232 has a groove 233 over the cantilever structure to facilitate dicing and to improve access of etchant to the cantilever structure. The glass cover also has a cover hole (through hole) 235 that will allow access of etchant to the fourth material at the location of the cover hole 235 and at the location of the etchant window 299 with which it is in direct communication. The elongated shape of the etchant window 299 provides on the one hand excellent access of etchant for quick removal of the fourth material without resulting in a significant weakening of the probe that would adversely affect its capability to withstand high pressures during use of the probe, because of the relatively small width (span) between opposite sides of the third layer 203 defining the etchant window 299.

Figure 11:
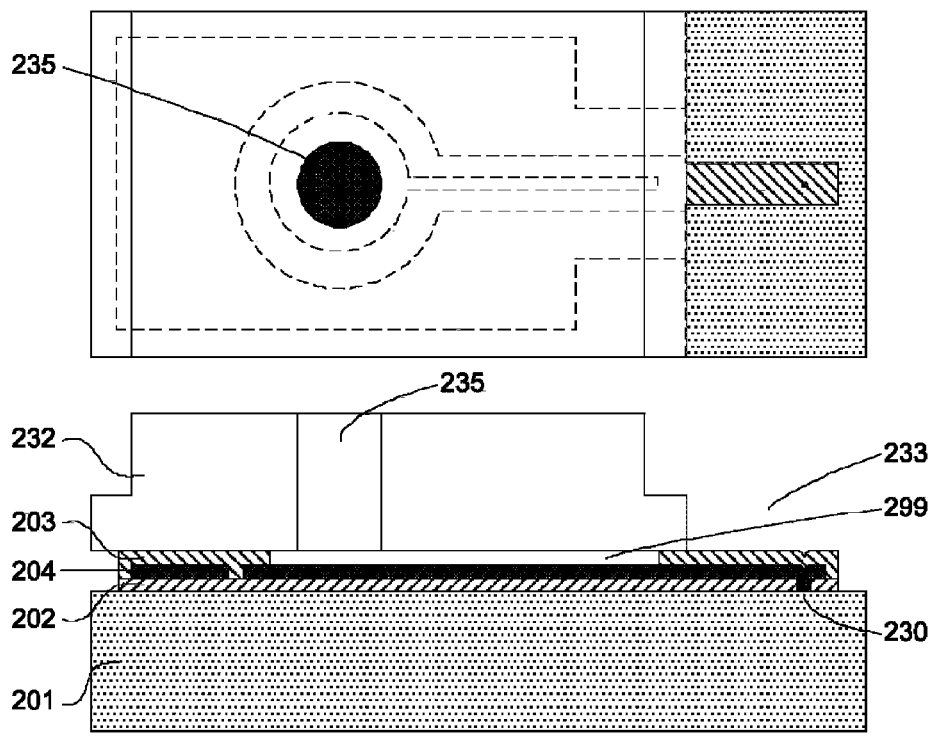
Figure 12:
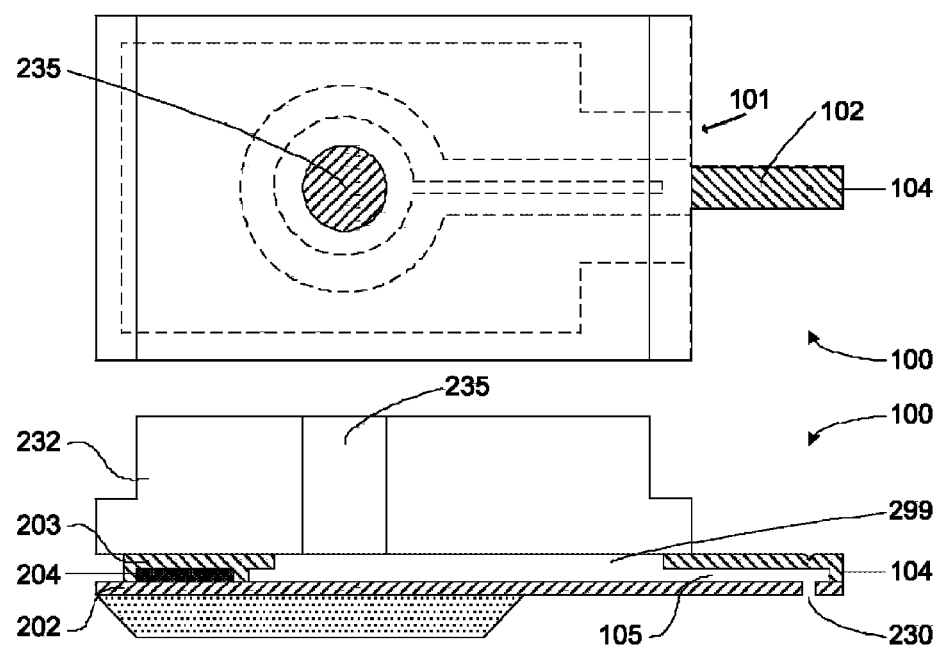

Thus an array of adjacent planar half-products (one of which is shown in FIG. 11) is formed which are subsequently etched. The first layer 201 and fourth layer 204 are etched using KOH/water. Because of the etchant window 299, the elongated conduit 105 is created before all material of the first layer 201 is removed at the location of the cover hole 235 (FIG. 12). It should be noted that the etchant removes substantially all the fourth material to form the conduit 105 from two ends, as soon as first material is removed at the location of the hole 230.

After the etching is completed, with first material of the first layer 201 remaining (albeit of reduced thickness) at the location of the cover hole 235—i.e. before an etch front of the first layer reaches the second layer at the location of the cover hole 235—and thus providing improved strength properties, the glass cover 232 is diced so as to yield the probes 100.

It goes without saying that many variations of the method according to the present invention are possible within the scope of the appended claims. For example, the method may involve steps to provide a cantilever having a tip between the base end and the distal end of the cantilever, generally close to the distal end. The conduit may or may not have an outlet opening in said tip.

The invention claimed is:

1. A method of manufacturing a probe, said probe comprising
   a planar substrate, and
   a cantilever extending from said planar substrate, said cantilever having a base end connected to the planar substrate and a distal end, and
   a conduit extending from i) a first opening at the planar substrate at a location on the planar substrate away from the cantilever to ii) a second opening in the cantilever away from the base end;
the method comprising steps of:
   providing a first layer of a first material;
   providing a second layer on the first layer, the second layer being of a second material different from the first material, the second layer comprising a hole within a distal end of a patterned cantilever structure;
   providing a sacrificial layer of a fourth material on the second layer, the fourth material being different from the second material, the fourth material filling the hole;
   etching the sacrificial layer to define an elongated sacrificial conduit core of the fourth material;
   depositing a third layer of a third material on top of i) the second layer and ii) the elongated sacrificial conduit core to define a sandwich, the third material being different from the first and fourth material, the sandwich having a first side at a side of the first layer and a second side at a side of the third material;
   etching the third layer to define an etching window with an elongated shape exposing a portion of the elongated sacrificial conduit core;
   covering the second side of the sandwich with a cover having a cover hole, such that the elongated sacrificial conduit core of the fourth material extends from the first layer at the patterned cantilever structure to the second side at the location of the cover hole, and such that the etchant window extends from the cover hole towards the distal end of the patterned cantilever structure over part of the distance from the cover hole to the base end;

exposing:
the first side,
the elongated sacrificial conduit core at the second side and through the etchant window, and
the edge of the planar half-product towards which the patterned cantilever structure points;

thereby defining a planar half-product; and etching the planar half-product to remove all of the elongated sacrificial conduit core by etching through the cover hole and etchant window and to remove a portion of the first layer, ending the step of etching the planar half-product before an etch front of the first layer reaches the location of the first opening on the planar substrate, such that the step of etching the planar half-product forms:
a freely extending cantilever, and
an open conduit between the cover hole and the distal end.

2. The method according to claim 1, wherein the step of providing the first layer comprises providing a first substrate of the first material to act as the first layer with the second layer;

the step of providing the second layer comprises removing material from the second layer of the second material to form the first hole in the second layer; and the step of covering locates the cover such that the cover hole coincides with a first end of the elongated sacrificial conduit core and leaves the first end of the elongated sacrificial conduit part of the fourth layer exposed.

3. The method according to claim 1, wherein the cover is a glass cover.

4. The method according to claim 1, wherein the etching of the planar half-product is performed with an etchant chosen such that it etches both the material of the first layer and the material of the fourth layer.

5. The method according to claim 1, wherein the first material is silicon.

6. The method according to claim 1, wherein the fourth material is silicon.

7. The method according to claim 1, wherein the material of the second layer and the material of the third layer are independently chosen from silicon nitride and silicon oxide.

* * * * *